US009214526B2

(12) United States Patent
Takaya et al.

(10) Patent No.: US 9,214,526 B2
(45) Date of Patent: Dec. 15, 2015

(54) SEMICONDUCTOR DEVICE

(71) Applicants: TOYOTA JIDOSHA KABUSHIKI KAISHA, Toyota-shi, Aichi-ken (JP); DENSO CORPORATION, Kariya-shi, Aichi-ken (JP)

(72) Inventors: Hidefumi Takaya, Toyota (JP); Yukihiko Watanabe, Nagoya (JP); Sachiko Aoi, Nagoya (JP); Atsuya Akiba, Kariya (JP)

(73) Assignees: TOYOTA JIDOSHA KABUSHIKI KAISHA, Toyota (JP); DENSO CORPORATION, Kariya (JP)

( * ) Notice: Subject to any disclaimer, the term of this patent is extended or adjusted under 35 U.S.C. 154(b) by 0 days.

(21) Appl. No.: 14/557,662

(22) Filed: Dec. 2, 2014

(65) Prior Publication Data

US 2015/0171175 A1    Jun. 18, 2015

(30) Foreign Application Priority Data

Dec. 17, 2013    (JP) .................................. 2013-259764

(51) Int. Cl.
*H01L 29/78*    (2006.01)
*H01L 29/423*    (2006.01)

(52) U.S. Cl.
CPC ........ *H01L 29/4236* (2013.01); *H01L 29/7813* (2013.01)

(58) Field of Classification Search
CPC .. H01L 29/4236; H01L 29/7813; H01L 29/78
USPC ................................................. 257/330, 332
See application file for complete search history.

(56) References Cited

U.S. PATENT DOCUMENTS

| 7,427,800 B2 * | 9/2008 | Yilmaz .......................... 257/488 |
| 7,999,312 B2 * | 8/2011 | Takaya et al. ................. 257/331 |
| 8,598,652 B2 * | 12/2013 | Takaya .......................... 257/331 |
| 2010/0224932 A1 * | 9/2010 | Takaya et al. ................. 257/330 |
| 2010/0258856 A1 * | 10/2010 | Hsieh .............................. 257/328 |
| 2013/0285140 A1 * | 10/2013 | Kagawa et al. ................ 257/330 |
| 2014/0252465 A1 * | 9/2014 | Takaya et al. ................. 257/330 |
| 2015/0041887 A1 * | 2/2015 | SOENO et al. ................ 257/330 |

FOREIGN PATENT DOCUMENTS

| JP | A-2005-116822 | 4/2005 |
| JP | A-2009-81412 | 4/2009 |

* cited by examiner

*Primary Examiner* — Allan R Wilson
(74) *Attorney, Agent, or Firm* — Oliff PLC (57) ABSTRACT

A semiconductor device includes: a drift layer having a first conductivity type; a body layer having a second conductivity type; a first semiconductor region having the first conductivity type; a gate insulation film; a trench gate electrode; a first main electrode; a second semiconductor region having the second conductivity type; and a conductor region. The first main electrode is electrically connected with the body layer and the first semiconductor region. The second semiconductor region is disposed on a bottom part of the gate trench, and is surrounded by the drift layer. The conductor region is configured to electrically connect the first main electrode with the second semiconductor region and is configured to equalize, when the semiconductor device is in an off-state, a potential of the second semiconductor region and a potential of the first main electrode.

9 Claims, 9 Drawing Sheets

SEMICONDUCTOR DEVICE

INCORPORATION BY REFERENCE

The disclosure of Japanese Patent Application No. 2013-259764 filed on Dec. 17, 2013 including the specification, drawings and abstract is incorporated herein by reference in its entirety.

BACKGROUND OF THE INVENTION

1. Field of the Invention

The present invention relates to a trench gate semiconductor device. In more detail, the present invention relates to a technology that alleviates an electric field applied to a gate oxide film that covers a trench gate electrode.

2. Description of Related Art

Japanese Patent Application Publication No. 2005-116822 (JP 2005-116822 A) discloses a trench gate semiconductor device (power MOS) that controls electric continuity between a drain and a source by voltage application to a gate electrode. The semiconductor device includes a gate trench that penetrates through a body layer from an upper surface of a semiconductor substrate and extends to an inside of a drift layer. A floating region is formed on a bottom part of the gate trench, and the floating region is separated from the body layer by the drift layer. In the semiconductor device, in a state in which a voltage by which a drain side becomes a high voltage to a source side is applied between the drain and the source (that is, in a state in which a forward bias voltage is applied to the semiconductor device), a current flows between the drain and the source (so-called on-state) when a voltage equal to or more than a predetermined threshold value is applied to the gate electrode. On the other hand, in a state in which the forward bias voltage is applied to the semiconductor device, the current that flows between the drain and the source is cut off (so-called, off-state) when a gate electrode voltage is made less than the predetermined threshold value. In the off-state, a depletion layer extends at a pn junction location of the drift layer and the body layer and extends at the pn junction location of the floating region and the drift layer, and the two pn junction locations become peaks of electric field intensity. Thus, peak values of the electric field intensity are dispersed, and a withstand voltage can be improved thereby.

In recent years, from the viewpoint of improvement in an energy efficiency and the like, an effort for achieving a higher withstand voltage of a semiconductor device is forwarded, and also a voltage applied to the semiconductor device becomes higher. In the trench gate semiconductor device, when the voltage applied to the semiconductor device becomes a high voltage, also an electric field applied to the gate oxide film becomes high. In particular, an electric field concentration tends to occur at a corner part of a lower end of the trench gate electrode, and thus the electric field applied to the gate oxide film in this part becomes high. Also in the semiconductor device according to JP 2005-116822 A, this problem still exists.

SUMMARY OF THE INVENTION

The present invention provides a trench gate semiconductor device that can reduce an electric field applied to a gate oxide film.

A trench gate semiconductor device according to an aspect of the present invention includes: a drift layer having a first conductivity type; a body layer having a second conductivity type; a first semiconductor region having the first conductivity type; a gate insulation film; a trench gate electrode; a first main electrode; a second semiconductor region having the second conductivity type; and a conductor region. The body layer is in contact with an upper surface of the drift layer. The first semiconductor region is disposed in a part of an upper surface of the body layer and separated from the drift layer by the body layer. The gate insulation film is formed at a wall surface of a gate trench, the gate trench penetrating through the body layer and reaching an inside of the drift layer. The trench gate electrode is disposed in the gate insulation film and faces a part of the body layer via the gate insulation film, the part of the body layer being configured to separate the drift layer and the first semiconductor region. The first main electrode is electrically connected with the body layer and the first semiconductor region. The second semiconductor region is disposed on a bottom part of the gate trench and surrounded by the drift layer. The conductor region is constituted to electrically connect at least one of the body layer and the first main electrode with the second semiconductor region and is configured to equalize, when the semiconductor device is in an off-state, a potential of the second semiconductor region and a potential of the at least one of the body layer and the first main electrode. Here, the off-state means a state in which in a state in which a forward voltage is applied between the first main electrode and the drift layer, a voltage applied to the trench gate electrode is less than the predetermined threshold value. On the other hand, a state in which, in a state in which the forward voltage is applied between the first main electrode and the drift layer, the voltage applied to the trench gate electrode is equal to or more than the predetermined threshold value is called as an on-state. The threshold value described above is determined by characteristics of the semiconductor device, in the off-state, the current between the first main electrode and the drift layer is cut off, and in the on-state, the current flows between the first main electrode and the drift layer.

In the semiconductor device, in the off-state, from the pn junction location of the second semiconductor region and the drift layer, a depletion layer extends. Under such conditions, the second semiconductor region is electrically conductive with the first main electrode or the body layer and becomes the same potential as the first main electrode or the body layer. Therefore, compared with a case in which the second semiconductor region is the floating region, the depletion layer can be extended from the pn junction location, which makes it possible to reduce remarkably the electric field applied to the gate oxide film.

BRIEF DESCRIPTION OF THE DRAWINGS

Features, advantages, and technical and industrial significance of exemplary embodiments of the invention will be described below with reference to the accompanying drawings, in which like numerals denote like elements, and wherein:

FIG. 8 is a first diagram for describing a manufacturing method of the semiconductor device 1a;

FIG. 9 is a second diagram for describing the manufacturing method of the semiconductor device 1a;

FIG. 10 is a third diagram for describing the manufacturing method of the semiconductor device 1a;

FIG. 11 is a fourth diagram for describing the manufacturing method of the semiconductor device 1a;

FIG. 12 is a first diagram for describing another manufacturing method of the semiconductor device 1a;

FIG. 13 is a second diagram for describing the another manufacturing method of the semiconductor device 1a;

FIG. 14 is a third diagram for describing the another manufacturing method of the semiconductor device 1a; and FIG. 15 is a fourth diagram for describing the another manufacturing method of the semiconductor device 1a.

DETAILED DESCRIPTION OF EMBODIMENTS

Hereinafter, some of technical features of embodiments of the present invention will be described. Each of items described below singularly has technical usability.

In the semiconductor device according to an embodiment of the present invention, the second semiconductor region may be disposed over an entire bottom part of the gate trench. A conductor region may be disposed along a part of a sidewall surface of the gate trench. Since the conductor region is not disposed over an entire sidewall surface of the gate trench, a current flow can be suppressed from being excessively disturbed by the conductor region. Alternatively, the conductor region may be disposed in the gate trench. By disposing in the gate trench, the conductor region can be disposed at a desired position.

In the semiconductor device according to an embodiment of the present invention, the conductor region may be formed along a part of the sidewall surface of the gate trench. Further, while a first end of the conductor region is connected with the second semiconductor region, a second end of the conductor region may be connected with the body region. Further, the second end of the conductor region may be in contact with the gate insulation film. Further, the conductor region may be a semiconductor region that has the second conductivity type and that is in contact with the drift layer. Further, a concentration of a second conductivity type impurity of the conductor region may be higher than a concentration of the second conductivity type impurity in the second semiconductor region. According to a configuration like this, when an amount of the second conductivity type impurity that is implanted in the trench sidewall surface is controlled, in the off-state, a complete depletion can be prevented, and the conductor region can be readily formed along the trench sidewall surface.

The semiconductor device of the embodiment of the present invention may further include an insulator that insulates the conductor region from the drift layer, the body layer and the trench gate electrode. The conductor region may be disposed in a part in the gate trench. Further, the first end of the conductor region may be connected with the second semiconductor region. Further, the second end of the conductor region may be connected with the first main electrode. According to the configuration like this, the conductor region can be disposed in a desired position in the gate trench.

In the semiconductor device of the embodiment of the present invention, the gate insulation film may be formed thicker in a thickness of a second part that covers a bottom surface of the gate trench than in the thickness of a first part that covers a side surface of the gate trench. According to a configuration like this, since the second semiconductor region disposed in a gate trench bottom part is disposed at a position far away from a boundary of the body layer and the drift layer, an on-resistance can be reduced while increasing the withstand voltage.

Figure 1:
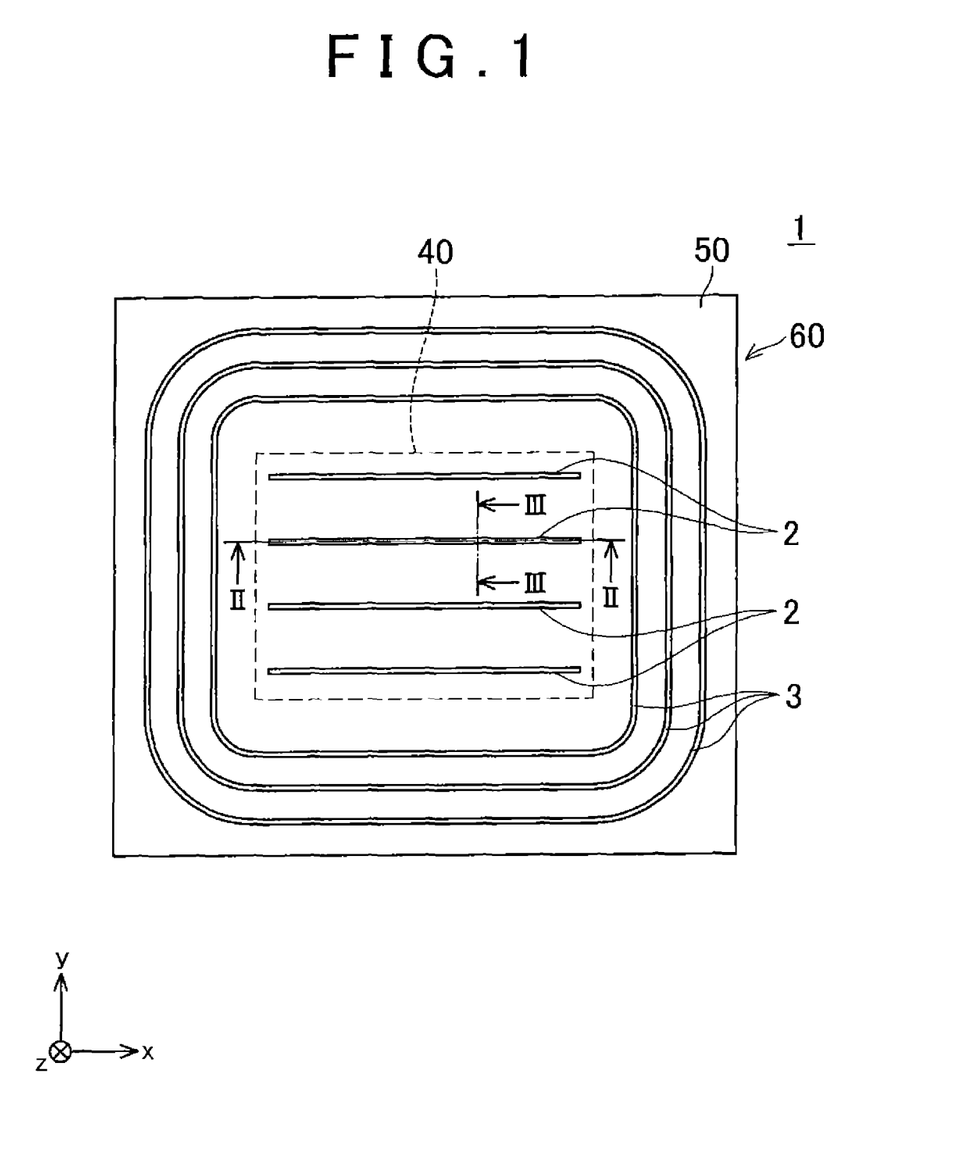
FIG. 1 is a plan view of a semiconductor device 1 according to a first embodiment of the present invention.

Hereinafter, with reference to drawings, a semiconductor device of a first embodiment of the present invention will be described. As shown in FIG. 1, a semiconductor device 1 of the present embodiment includes a semiconductor substrate 60, electrodes, an insulation film and other elements. The electrodes, insulation film and other elements are formed on an upper surface and a lower surface of the semiconductor substrate 60 and not shown in FIG. 1. The semiconductor substrate 60 is a SiC substrate and includes a cell area 40 in which a current flows and a terminal area 50 that surrounds the cell area 40. In the cell area 40, a plurality of gate trenches 2 are disposed. The plural gate trenches 2 extend linearly in an X-direction and disposed spaced apart in a Y-direction. In the terminal area 50, a plurality of terminal trenches 3 are disposed. The terminal trench 3 is formed annularly so as to surround the cell area 40. A corner part of the terminal trench 3 is formed into an arc shape. In the present embodiment, the SiC substrate is used as the semiconductor substrate. However, a Si substrate may be used as the semiconductor substrate instead of the SiC substrate.

Figure 2:
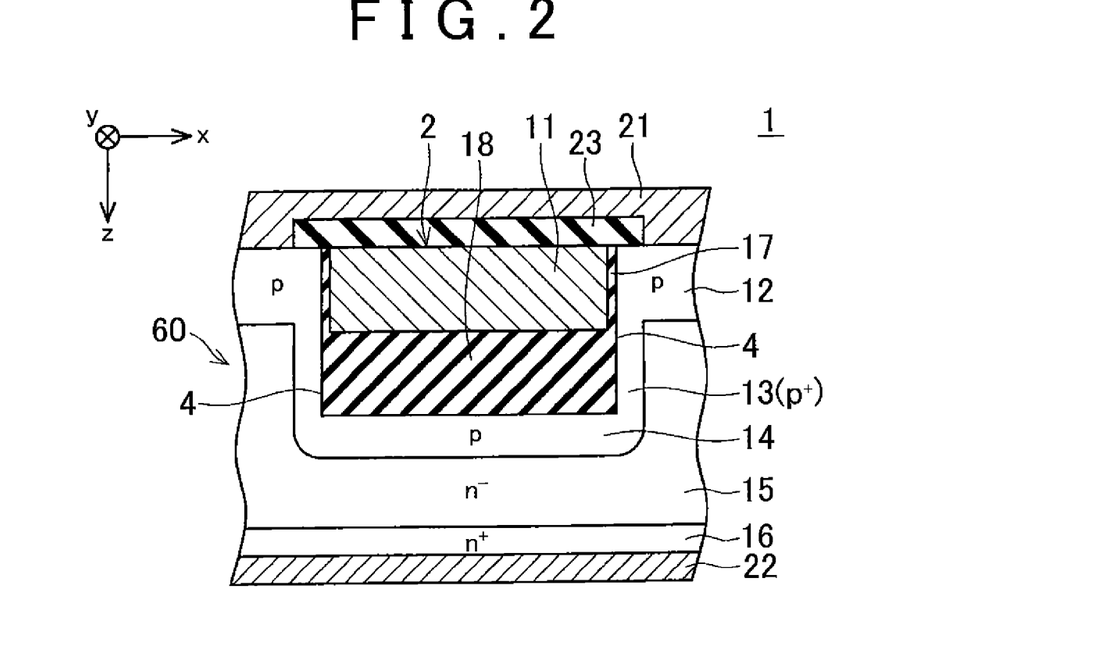
FIG. 2 is a cross-sectional view taken along a II-II line of FIG. 1.
Figure 3:
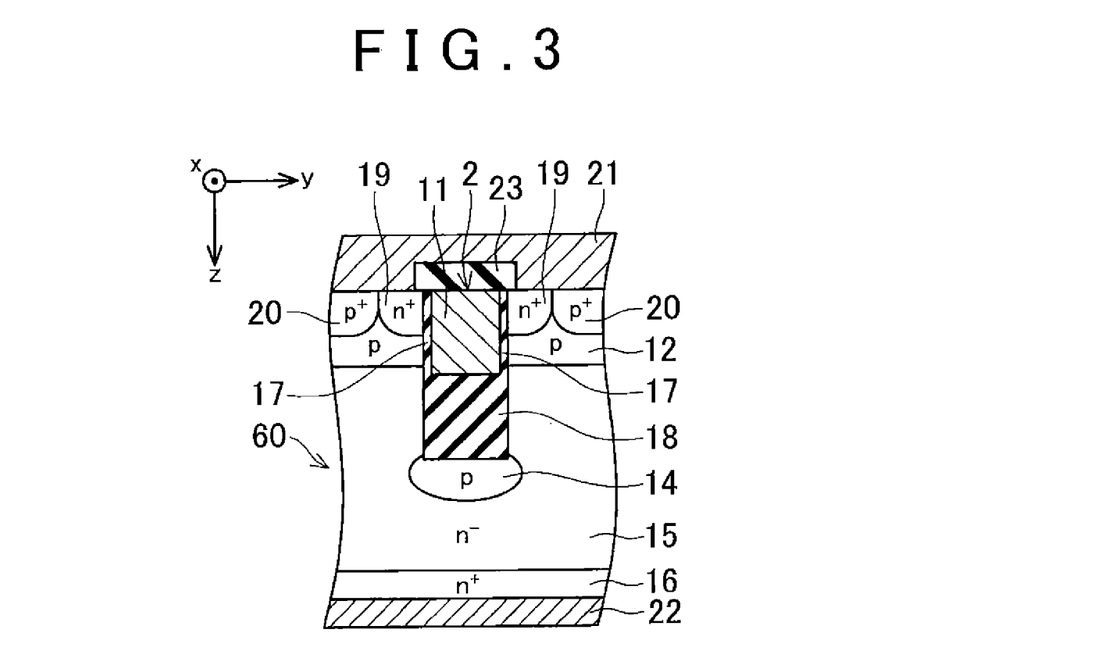
FIG. 3 is a cross-sectional view taken along a III-III line of FIG. 1.

As shown in FIGS. 2 and 3, in the cell area 40, a source region 19, a body contact region 20, a body layer 12, a drift layer 15 and a drain layer 16 are formed. The source region 19 is exposed on an upper surface of the semiconductor substrate 60. The source region 19 is an n-type semiconductor region and is in an ohmic connection with a source electrode 21. The source region 19 is formed island-like along a lengthwise direction (X-direction) of the gate trench 2. The body contact region 20 is disposed adjacent to the source region 19 and exposed on the upper surface of the semiconductor substrate 60. The body contact region 20 is a p-type semiconductor region and in an ohmic connection with the source electrode 21.

The body layer 12 is a p-type semiconductor layer and in contact with lower surfaces of the source region 19 and the body contact region 20. The drift layer 15 is an n-type semiconductor layer and in contact with a lower surface of the body layer 12. The drift layer 15 is separated from the source region 19 by the body layer 12. The drain layer 16 is an n-type semiconductor layer and in contact with a lower surface of the drift layer 15. The drain layer 16 is separated from the body layer 12 by the drift layer 15. An n-type impurity concentration of the drain layer 16 is set higher than the n-type impurity concentration of the drift layer 15. The drain layer 16 is exposed on a lower surface of the semiconductor substrate 60. The drain layer 16 is in an ohmic connection with a drain electrode 22.

The gate trench 2 penetrates through the source region 19 and the body layer 12 from the upper surface of the semiconductor substrate 60 and extend to the drift layer 15. A gate insulation film 17, an insulator 18 and a gate electrode 11 are formed in the gate trench 2. The insulator 18 is filled in a bottom part of the gate trench 2. An upper surface of the insulator 18 is located below an upper surface of the drift layer 15 (that is, a lower surface of the body layer 12). The gate insulation film 17 is formed at the sidewall surface of the gate trench 2. The gate insulation film 17 is in contact with the source region 19 and the body layer 12. A lower end of the gate insulation film 17 is connected with an upper surface of the insulator 18. Thicknesses of the gate insulation film 17 (thicknesses in Y-direction and X-direction) are set thinner than a thickness of the insulator 18 (a thickness in Z-direction). The gate electrode 11 is disposed in the gate trench 2 in a state in which a bottom surface and a side surface of the gate electrode 11 are covered with the insulator 18 and the gate insulation film 17. A lower surface of the gate electrode 11 (that is, an upper surface of the insulator 18) is located slightly below the lower surface of the body layer 12. Therefore, the gate electrode 11 faces the body layer 12 that separates the source region 19 and the drift layer 15 via the gate insulation film 17. An upper surface of the gate electrode 11 is covered with an insulation film 23 and insulated from the source electrode 21.

Further, a diffusion region 14 and a trench side surface region 13 are formed in the semiconductor substrate 60. The diffusion region 14 is a p-type semiconductor region and formed so as to cover the bottom surface of the gate trench 2. The diffusion region 14 is located in the drift layer 15. A circumference of the diffusion region 14 is surrounded by the drift layer 15. The diffusion region 14 is separated from the body layer 12 by the drift layer 15. The diffusion region 14 is formed over an entire region of the bottom part of each of the plural gate trenches 2. That is, the diffusion region 14 is formed over an entirety of the bottom part of the gate trench 2. The trench side surface region 13 is a p-type semiconductor region and formed along side surfaces 4 that are located on both ends in a lengthwise direction (X-direction) of the gate trench 2. An upper end of the trench side surface region 13 is connected with the body layer 12, and a lower end of the trench side surface region 13 is connected with the diffusion region 14.

A p-type impurity concentration of the trench side surface region 13 is set higher than the p-type impurity concentration of the diffusion region 14. Specifically, the p-type impurity concentration and the thickness of the trench side surface region 13 are set such that when an off-voltage described below is applied to the gate electrode 11 in a state in which a maximum voltage allowable in terms of design is applied between the drain electrode 22 and the source electrode 21 of the semiconductor device 1, the trench side surface region 13 is not completely depleted. That is, in the semiconductor device 1 of the present embodiment, the trench side surface region 13 is not completely depleted in a state in which a rated voltage (a rated voltage by which the drain electrode is a high potential with respect to the source electrode) is applied between the source electrode 21 and the drain electrode 22.

On the other hand, the drain layer 16, the drift layer 15 and the body layer 12 are stacked in the terminal area 50 in such an order from the lower surface side of the semiconductor substrate 60. The terminal trench 3 penetrates through the body layer 12 from the upper surface of the semiconductor substrate 60 and extends to the drift layer 15. A position of the lower end of the terminal trench 3 is set to the same position as the lower end of the gate trench 2. The insulator is filled in the terminal trench 3.

The semiconductor device 1 described above can be manufactured according to the same manufacturing method as that of a conventional semiconductor device. That is, when an impurity ion is implanted to form the diffusion region 14 in the bottom part of the gate trench 2, the trench side surface regions 13 can be formed by obliquely implanting an ion on both end surfaces in a lengthwise direction of the gate trench 2. Therefore, the semiconductor device 1 can be manufactured without adding a new manufacturing step.

Next, an operation of the semiconductor device 1 will be described. The semiconductor device 1 is used by connecting the source electrode 21 (that is, the source region 19 and the body contact region 20) with a ground potential and the drain electrode 22 (that is, the drain layer 16) with a power source potential (a potential higher than the ground potential). In a state in which the semiconductor device 1 is connected with the power source potential and the ground potential, when a voltage (hereinafter, referred to as an on-voltage) higher than a threshold voltage (a voltage by which a channel is formed in the body layer 12) is applied to the gate electrode 11, the semiconductor device 1 is turned on (hereinafter, referred to as an on-state), and a current flows between the source electrode 21 and the drain electrode 22. On the other hand, when a voltage lower than the threshold potential (hereinafter, referred to as an off-voltage) is applied to the gate electrode 11, the semiconductor device 1 is turned off (hereinafter referred to as an off-state), and the current that flows between the source electrode 21 and the drain electrode 22 is cut off.

In the off-state of the semiconductor device 1 (a state in which the current that flows to the semiconductor device 1 is cut off), depletion layers extend from a pn junction location between the body layer 12 and the drift layer 15, from the pn junction location between the trench side surface region 13 and the drift layer 15, and from the pa junction location between the diffusion region 14 and the drift layer 15. At this time, since the trench side surface region 13 is not completely depleted, the diffusion region 14 and the body layer 12 are electrically conductive via the trench side surface region 13 and both are in the same potential. That is, the diffusion region 14 and the body layer 12 are grounded via the body contact region 20 and the source electrode 21. Therefore, the depletion layer from the pn junction location between the diffusion region 14 and the drift layer 15 is promoted to extend and an electric field applied to the insulator 18 and the gate insulation film 17 is more alleviated. Therefore, compared with a conventional technology in which the diffusion region 14 is made a floating state, electric field moderation performance of the semiconductor device 1 can be improved.

On the other hand, when an on-potential is applied to the gate electrode and the semiconductor device 1 is turned to the on-state, among the body layer 12, a region that faces the gate electrode 11 via the gate insulation film 17 is reversed to an n-type, and a channel region is formed thereby. When the channel region is formed in the body layer 12 and then the source region 19 and the drift layer 15 are connected by the channel region, electrons move from the source region 19 to the drift layer 15 via the channel region such that a current flows between the source electrode 21 and the drain electrode 22.

Further, the trench side surface region 13 is disposed along both side surfaces 4 in a lengthwise direction (X-direction) of the gate trench 2. Therefore, the channel region that is formed along both side surfaces of the gate trench 2 in a direction (Y-direction) orthogonal to the lengthwise direction does not interfere with the trench side surface region 13. Therefore, even when the trench side surface region 13 is formed in the semiconductor device 1, the performance of the semiconductor device 1 can be maintained without reducing the channel region.

When the SiC substrate is used as the semiconductor substrate, in order to achieve low on-resistance, it is necessary to reduce a thickness of the body layer since SiC has large channel resistance. When the thickness of the body layer is reduced, punch-through may be caused when a high voltage is applied on the semiconductor device. On the other hand, according to the semiconductor device 1 of the present embodiment, the body layer 12 and the diffusion region 14 are electrically conductive due to the trench side surface region 13. Thus, the depletion layer is promoted to extend from the pn junction location of the diffusion region 14 and the drift layer 15, and the punch-through can be suppressed from occurring thereby. Therefore, the thickness of the body layer 12 can be reduced and the low on-resistance can be realized thereby.

Here, in the embodiment described above, the trench side surface region 13 may be considered as the "conductor region" of the present invention, the source region 19 may be assumed as the "first semiconductor region" of the present invention, and the diffusion region 14 may be assumed as the "second semiconductor region" of the present invention.

Next, a semiconductor device 1a according to a second embodiment of the present invention will be described with reference to FIGS. 4 and 5. The semiconductor device 1a of the second embodiment is different from the semiconductor device 1 of the first embodiment in that the diffusion region of the bottom part of the gate trench is connected with the source electrode. The semiconductor device 1a of the second embodiment has the same configuration as the semiconductor device 1 of the first embodiment except the above difference. Hereinafter, a point different from the first embodiment will be described in more detail. The same reference numeral as the first embodiment are imparted to the like constituent parts with the semiconductor device 1 of the first embodiment.

Figure 4:
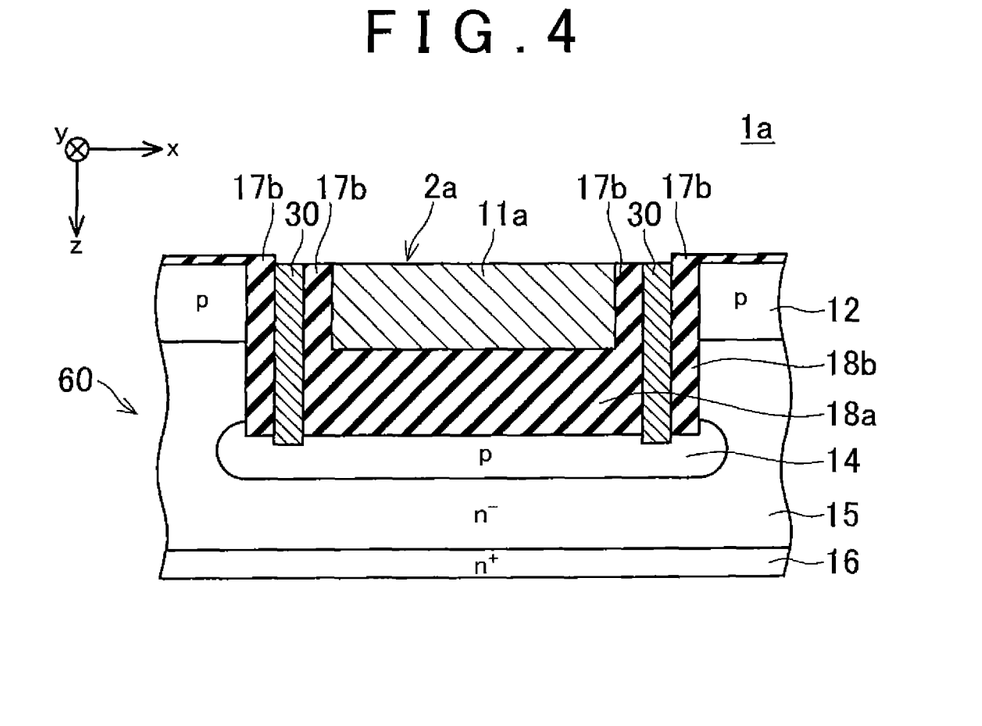
FIG. 4 is a cross-sectional view of a semiconductor device 1a according to a second embodiment of the present invention (a drawing corresponding to a cross-sectional view taken along the II-II line of FIG. 1)
Figure 5:
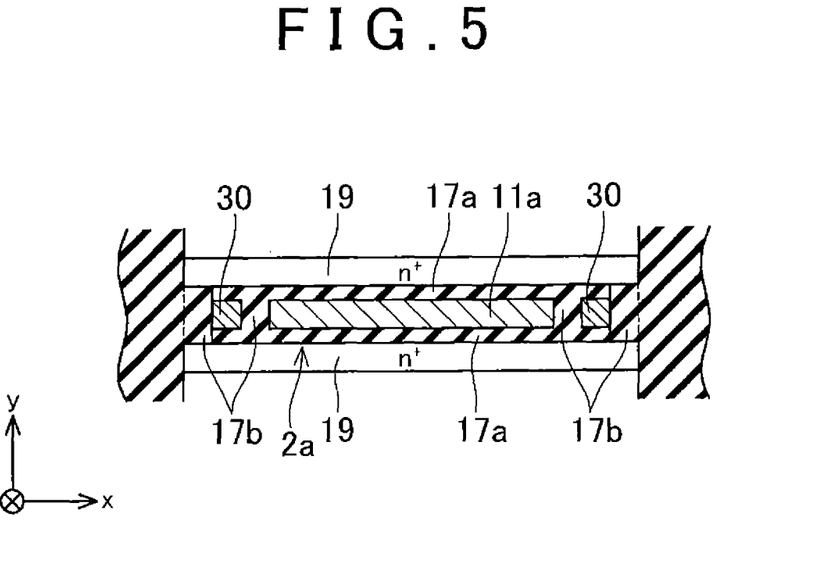
FIG. 5 is a diagram when a trench gate of the semiconductor device 1a of the second embodiment is viewed in a plan view.

As shown in FIGS. 4 and 5, the semiconductor device 1a includes a semiconductor substrate 60 in which a p-type body layer 12, an n-type drift layer 15, and an n-type drain layer 16 are formed. A gate trench 2a is formed in the semiconductor substrate 60, and a p-type diffusion region 14 is formed in a bottom part of the gate trench 2a.

A gate electrode 11a, insulators (17a, 17b, 18a, 18b), and a conductor region 30 are formed in the gate trench 2a. The insulator 18a is filled in a bottom part of the gate trench 2a. The gate electrode 11a is disposed on an upper surface of the insulator 18a. The gate electrode 11a is located in a substantial center of the gate trench 2a when the gate trench 2a is viewed in a plan view. A lateral side of the gate electrode 11a is surrounded with the insulators (17a, 17b). Specifically, one side surface (the side surface that is in parallel with the lengthwise direction thereof) of the gate electrode 11a is covered with the gate insulation film 17a and faces the source region 19 and the body layer 12 via the gate insulation film 17a. The other side surface of the gate electrode 11a (a side surface orthogonal to the lengthwise direction thereof) is covered with the insulator 17b.

The conductor region 30 is formed of a conductive material (for example, poly-silicon, metal (for example, aluminum) or the like) and disposed on both sides in a lengthwise direction of the gate electrode 11a. A distance is disposed between the conductor region 30 and the gate electrode 11a, and the insulator 17b is disposed therebetween. The conductor region 30 is insulated from the gate electrode 11a, the source region 19, the body layer 12 and the drift layer 15 by the insulators (17b and 18b). That is, a through hole that reaches the bottom surface of the gate trench 2a from the upper surface of the semiconductor substrate 60 is formed in the insulators (17a, 17b, 18a, 18b), and the conductor region 30 is formed in the through hole. The lower end of the conductor region 30 is connected with the diffusion region 14 and an upper end of the conductor region 30 is connected with the source electrode (not shown). Therefore, the diffusion region 14 is electrically conductive with the source electrode via the conductor region 30.

Also in the above-described semiconductor device 1a, the diffusion region 14 is connected with the source electrode (that is, a ground potential) via the conductor region 30. Therefore, in the off-state of the semiconductor device 1a, the depletion layer tends to extend from the pn junction location of the diffusion region 14 and the drift layer 15, and the electric field moderation performance of the semiconductor device 1a can be improved thereby. Further, the conductor region 30 is surrounded by the insulators (17b and 18b) in a circumference thereof and insulated from the gate electrode 11a, the body layer 12, and the source region 19. That is, the gate electrode 11a, the body layer 12, and the source region 19 are more suppressed from being influenced by the conductor region 30. Therefore, the conductor region 30 is more suppressed from influencing on the characteristics of the semiconductor device 1a. Further, the conductor region 30 is disposed at both ends in the lengthwise direction (X-direction) of the gate trench 2a. Therefore, the conductor region 30 can be disposed while sufficiently securing the channel region formed along the gate trench 2a.

Here, a manufacturing method of the above-described semiconductor device 1a will be described with reference to FIGS. 8 to 11. Since steps other than the step of forming a conductor region 30 in the gate trench 2a are the same as those of the conventional manufacturing method of the semiconductor device, a step of forming the conductor region 30 will be mainly described.

Figure 8:
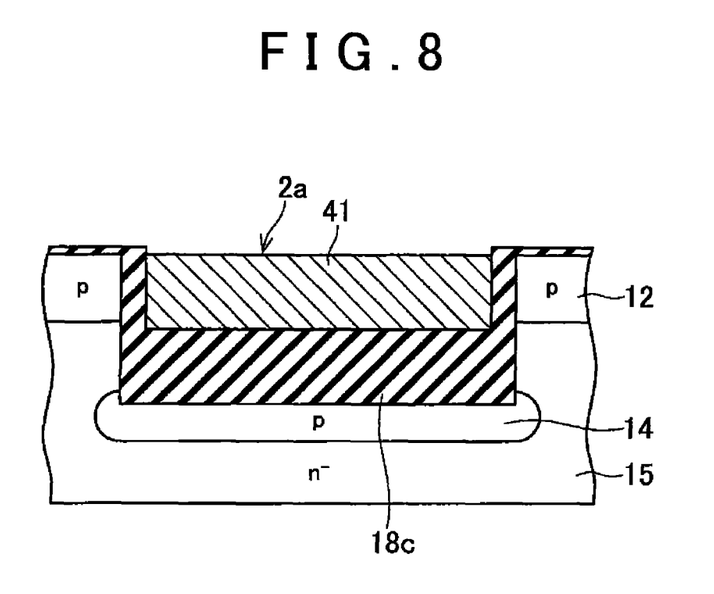

In order to manufacture the semiconductor device 1a, firstly, the semiconductor substrate 60 is processed according to a so far known method to obtain a state shown in FIG. 8. In the state shown in FIG. 8, the drift layer 15 and the body layer 12 are formed in the semiconductor substrate 60 and the gate trench 2a is formed on an upper surface of the semiconductor substrate 60. The diffusion region 14 is formed on a lower part of the gate trench 2a, and an insulator 18c and the conductor (poly-silicon) 41 are filled in the gate trench 2a.

Figure 9:
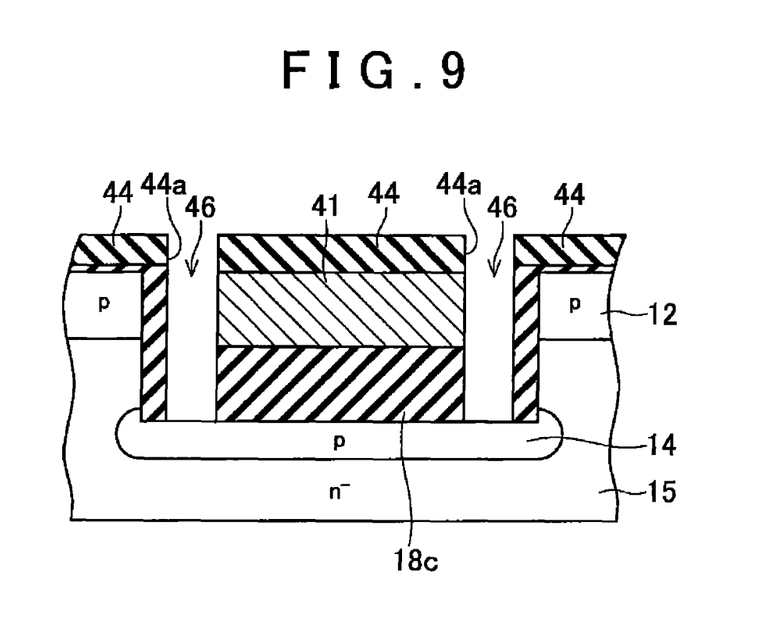

Next, as shown in FIG. 9, a resist pattern 44 is formed on the semiconductor substrate 60. The resist pattern 44 includes an opening part 44a in a region in which the conductor region 30 is formed. Then, the insulator 18c and the conductor 41 are etched with the resist pattern 44 as a mask. Thus, a trench 46 for forming the conductor region 30 is formed in the insulator 18c and the conductor 41. When the trench 46 is formed, the resist pattern 44 is removed. Here, the conductor 41 left after formation of the trench 46 becomes the gate electrode 11a.

Figure 10:
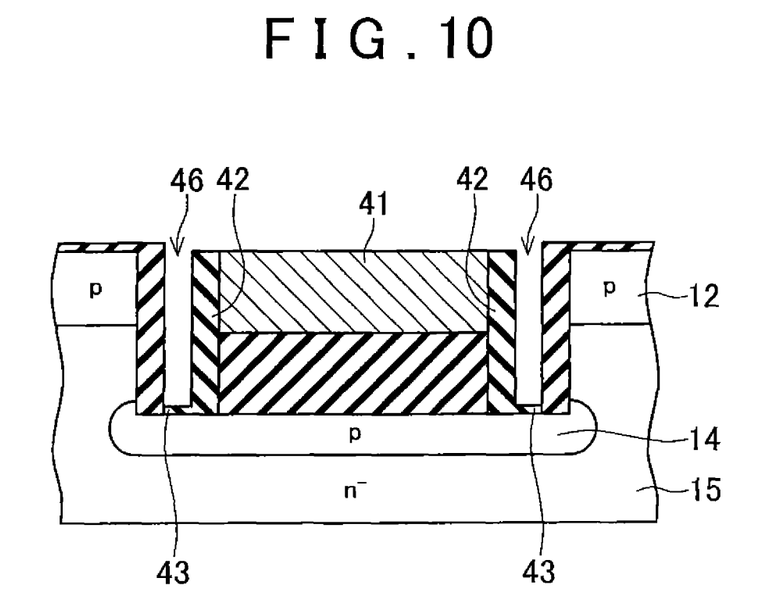
Figure 11:
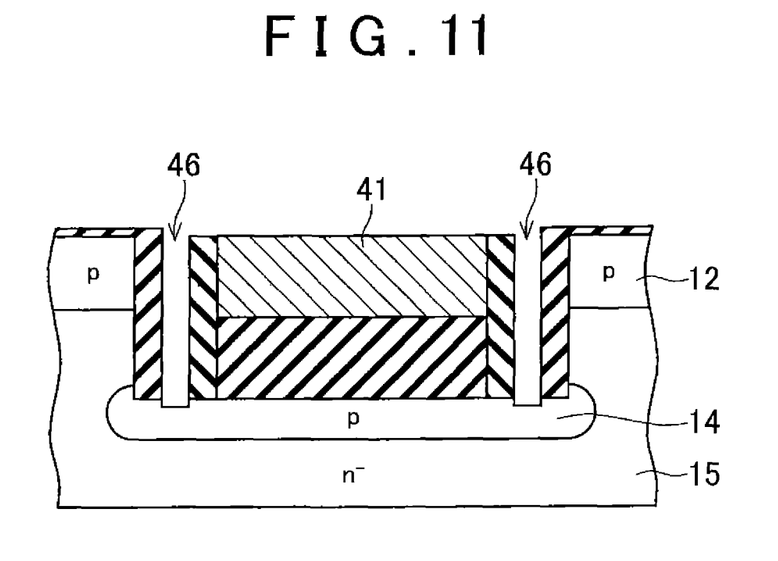

Next, as shown in FIG. 10, a side surface and a bottom surface of the trench 46 are thermally oxidized, and oxide films 42 and 43 are formed in these oxidized parts. Next, as shown in FIG. 11, the oxide film 43 on the bottom surface of the trench 46 is removed by dry etching with a mask. Thus, the trench 46 reaches the diffusion region 14. Thereafter, a material (for example, poly-silicon, metal or the like) to be the conductor region 30 is piled in the trench 46 and the conductor region 30 is formed in the trench 46. Thereafter, the semiconductor device can be manufactured in the same manner as the conventional semiconductor device.

In FIG. 10, when the side surface and the bottom surface of the trench 46 are thermally oxidized, thickness of the oxide film 42 formed on the side surface and the thickness of the oxide film 43 formed on the bottom surface are different. That is, since an oxidation rate of the poly-silicon is about 100 times higher than the oxidation rate of SiC, the oxide film 42 on the side surface of the trench 46 is formed thicker, while the oxide film 43 of the bottom surface of the trench 46 is formed thinner. Therefore, the gate electrode 11a and the conductor region 30 are completely separated and can be mutually insulated.

Figure 12:
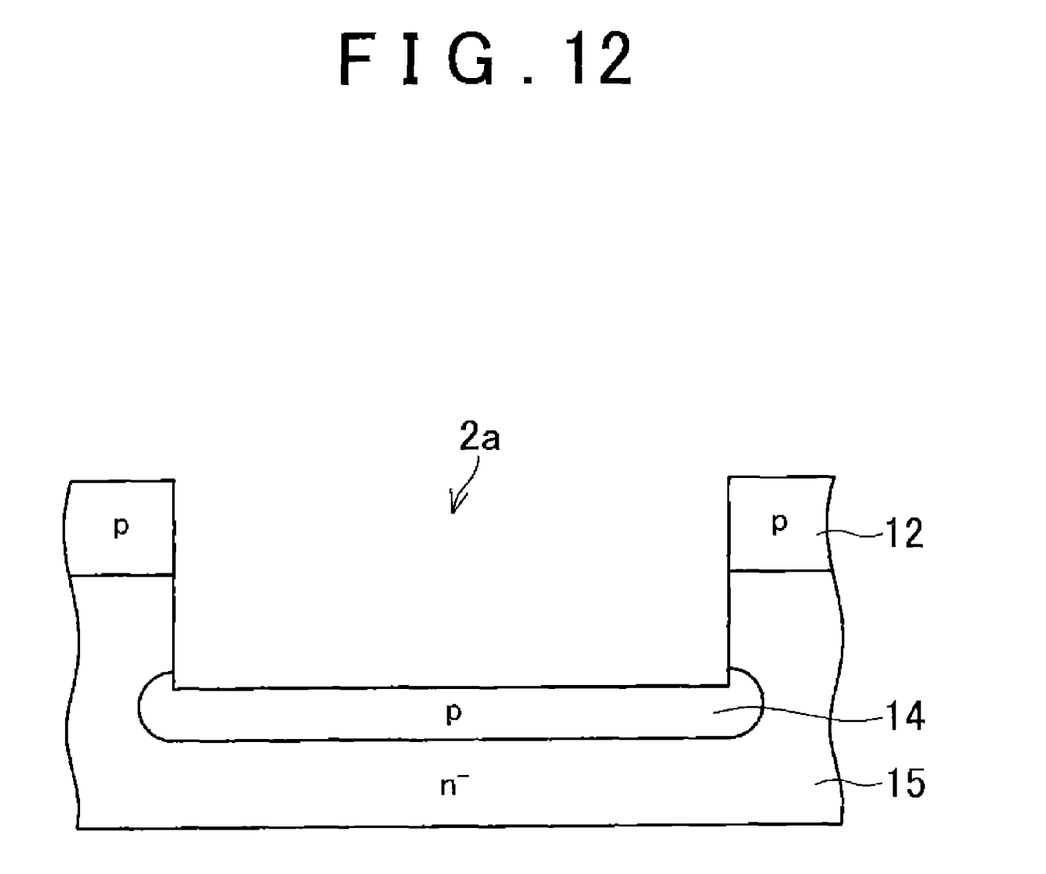

Other than the manufacturing method shown in FIGS. 8 to 11, another method which is shown in FIGS. 12 to 15 is available for manufacturing the semiconductor device 1a of the second embodiment. That is, as shown in FIG. 12, firstly, a gate trench 2a is formed in the semiconductor substrate 60, and the diffusion region 14 is formed in a bottom part of the gate trench 2a. The gate trench 2a and the diffusion region 14 are formed in the same manner as the conventional method.

Figure 13:
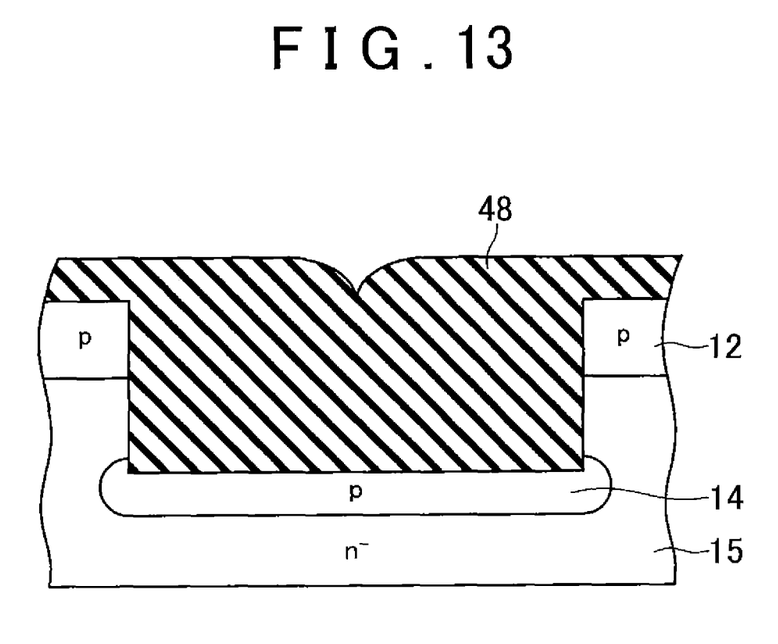
Figure 14:
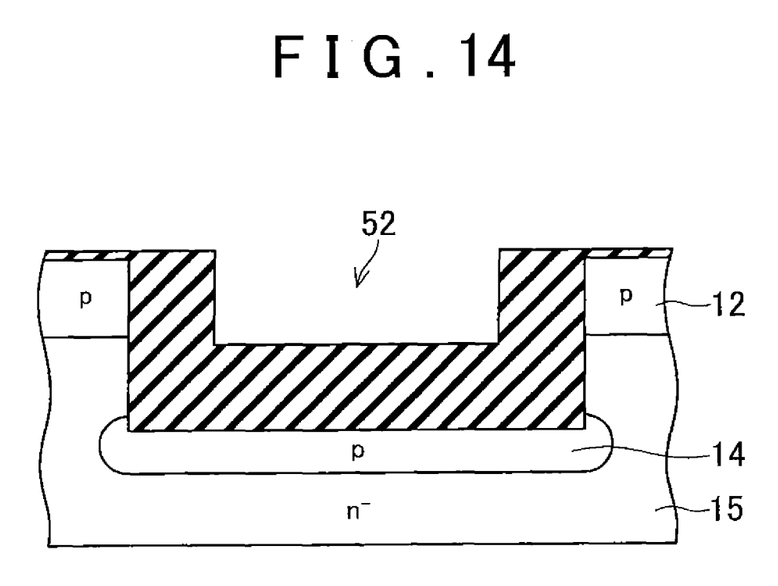
Figure 15:
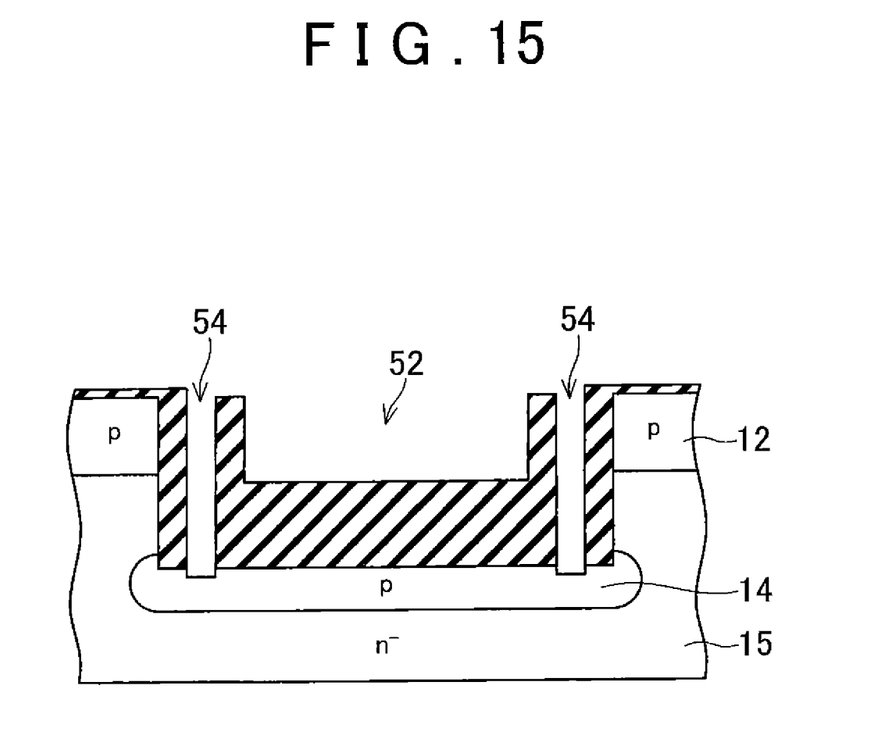

Next, as shown in FIG. 13, silicon oxide 48 is filled in the gate trench 2a by a CVD method. Then, as shown in FIG. 14, a part of the silicon oxide 48 filled in the gate trench 2a is removed by etching, and a trench 52 for forming the gate electrode 11a is formed. Next, as shown in FIG. 15, a part of the silicon oxide 48 is removed by further etching, and a trench 54 for forming the conductor region 30 is formed thereby. When the trenches 52 and 54 are formed, the poly-silicon is filled in the trenches 52 and 54 according to the CVD method. Thus, the gate electrode 11a and the conductor region 30 are simultaneously formed. Also according to the method like this, the semiconductor device 1a of the second embodiment can be manufactured. In the manufacturing method, the number of the steps can be suppressed from increasing by simultaneously forming the gate electrode 11a and the conductor region 30. Further, since the trench 54 is formed by processing the silicon oxide 48 filled in the gate trench 2a, a thickness of the oxide film that covers the conductor region 30 can be readily adjusted. Therefore, the withstand voltage performance of the semiconductor device 1a can be readily adjusted.

According to the manufacturing method described above, although the poly-silicon is filled in these trenches 52 and 54 after formation of the trenches 52 and 54, the manufacturing method of the semiconductor device 1a is not limited to the method like this. For example, as shown in FIG. 14, after the trench 52 is formed in the silicon oxide 48, the poly-silicon is subsequently filled in the trench 52 so as to form the gate electrode 11a. Then the trench 54 is formed, and the conductor region 30 is formed in the trench 54. According to the method like this, materials of the gate electrode 11a and the conductor region 30 can be differentiated. For example, the conductor region 30 may be formed of a metal material. Therefore, when the conductor region 30 is formed, a wiring layer formed on the upper surface side of the semiconductor substrate 60 can be formed.

In the above, specific embodiments of the present invention have been described in detail. However, these are only illustrations and do not limit the present invention. In the present invention, various alterations and modifications of the specific embodiments illustrated above are included.

Figure 6:
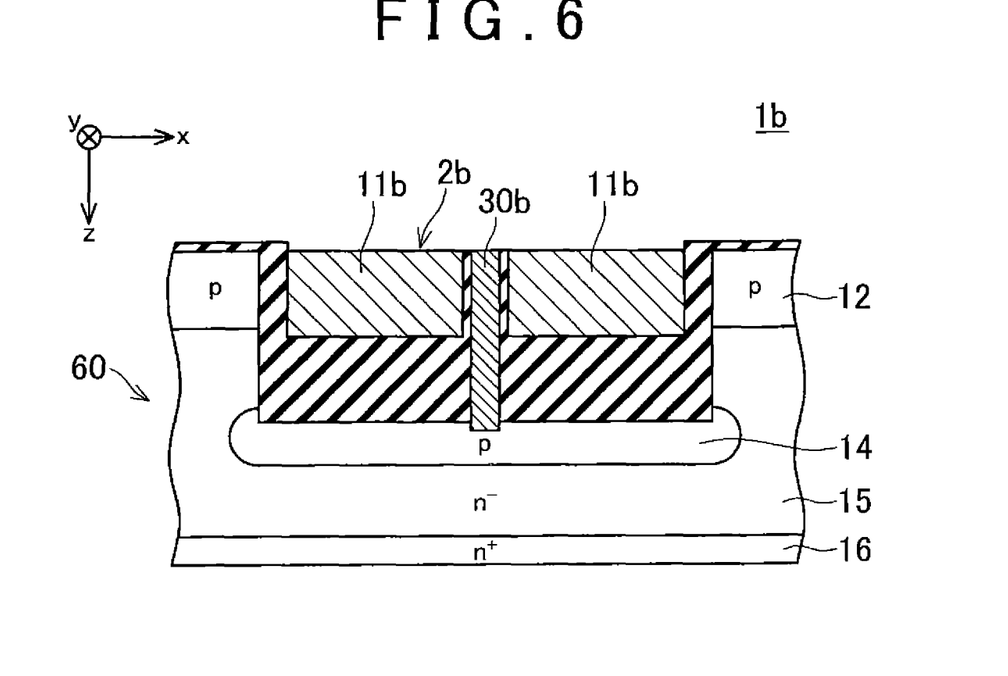
FIG. 6 is a cross-sectional view of a semiconductor device 1b according to a third embodiment of the present invention (a drawing corresponding to a cross-sectional view taken along the II-II line of FIG. 1)
Figure 7:
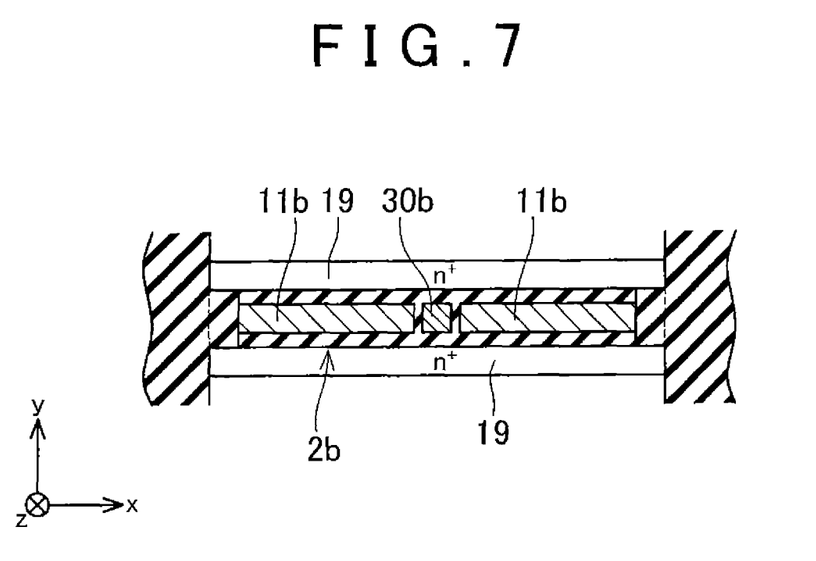
FIG. 7 is a diagram when a trench gate of the semiconductor device 1b of the third embodiment of the present invention is viewed in a plan view.

For example, although the conductor region 30 is formed on both sides of a lengthwise direction of the gate electrode Ha in the semiconductor device 1a according to the second embodiment, an arrangement pattern of the gate electrode and the conductor region, which are disposed in the gate trench 2a, is not limited to such an arrangement shown in the semiconductor device 1a according to the second embodiment. In detail, like a semiconductor device 1b of a third embodiment of the present invention, which is shown in FIGS. 6 and 7, two gate electrodes 11b are disposed in the gate trench 2b and a conductor region 30b may be disposed between these two gate electrodes 11b. Also by the configuration like this, the diffusion region 14 in the bottom part of the gate trench 2b can be connected with the source electrode via the conductor region 30b. According to the configuration like this, compared with the second embodiment, a region that the conductor region 30 occupies can be reduced. Therefore, a channel region formed along the gate trench 2b can be increased compared with the second embodiment.

Further, in the embodiment described above, the MOSFET is formed in the cell area. However, other semiconductor element such as an IGBT or the like may be formed as the semiconductor element that is formed in the cell area.

Technical elements described in the present specification or drawings may be considered to exert technical usability singularly or in various combinations thereof.

What is claimed is:

1. A trench gate semiconductor device comprising:
a drift layer that has a first conductivity type;
a body layer that has a second conductivity type and is in contact with an upper surface of the drift layer;
a first semiconductor region that has the first conductivity type, is disposed in a part of an upper surface of the body layer, and is separated from the drift layer by the body layer;
a gate insulation film that is formed at a wall surface of a gate trench, the gate trench penetrating through the body layer and reaching an inside of the drift layer;
a trench gate electrode that is disposed in the gate insulation film and faces a part of the body layer via the gate insulation film, the part of the body layer being configured to separate the drift layer and the first semiconductor region;
a first main electrode that is electrically connected with the body layer and the first semiconductor region;
a second semiconductor region that has the second conductivity type, is disposed on a bottom part of the gate trench, and is surrounded by the drift layer; and
a conductor region that is configured to electrically connect at least one of the body layer and the first main electrode with the second semiconductor region and is configured to equalize, when the semiconductor device is in an off-state, a potential of the second semiconductor region and a potential of the at least one of the body layer and the first main electrode,
wherein the conductor region is formed along a part of a side wall surface of the gate trench,
a first end of the conductor region is connected with the second semiconductor region,
a second end if the conductor region is connected with the body layer,
the conductor region is a semiconductor region that has the second conductivity type and that is in contact with the gate insulation film and in contact with the drift layer, and
a second conductivity type impurity concentration of the conductor region is higher than a second conductivity type impurity concentration of the second semiconductor region.

2. The semiconductor device according to claim 1, wherein the second semiconductor region is disposed over an entirety of the bottom part of the gate trench, and
the conductor region is disposed along a part of a side wall surface of the gate trench.

3. The semiconductor device according to claim 1, wherein the second semiconductor region is disposed over an entirety of the bottom part of the gate trench, and
the conductor region is disposed in a part in the gate trench.

4. The semiconductor device according to claim 1 further comprising an insulator that insulates the conductor region from the drift layer, the body layer, and the trench gate electrode, wherein the conductor region is disposed in a part in the gate trench, a first end of the conductor region is connected with the second semiconductor region, and a second end of the conductor region is connected with the first main electrode.

5. The semiconductor device according to claim 1, wherein the gate insulation film includes a first part and a second part, the first part covers a side surface of the gate trench, the second part covers a bottom surface of the gate trench, and a thickness of the second part is larger than a thickness of the first part.

6. The semiconductor device according to claim 1, wherein the gate insulation film includes a first part and a second part, the first part covers a side surface of the gate trench, the second part covers a bottom surface of the gate trench, and a thickness of the second part is larger than a thickness of the first part.

7. 1. A trench gate semiconductor device comprising:

a drift layer that has a first conductivity type;

a body layer that has a second conductivity type and is in contact with an upper surface of the drift layer;

a first semiconductor region that has the first conductivity type, is disposed in a part of an upper surface of the body layer, and is separated from the drift layer by the body layer;

a gate insulation film that is formed at a wall surface of a gate trench, the gate trench penetrating through the body layer and reaching an inside of the drift layer;

a trench gate electrode that is disposed in the gate insulation film and faces a part of the body layer via the gate insulation film, the part of the body layer being configured to separate the drift layer and the first semiconductor region;

a first main electrode that is electrically connected with the body layer and the first semiconductor region;

a second semiconductor region that has the second conductivity type, is disposed on a bottom part of the gate trench, and is surrounded by the drift layer; and a conductor region that is configured to electrically connect at least one of the body layer and the first main electrode with the second semiconductor region and is configured to equalize, when the semiconductor device is in an off-state, a potential of the second semiconductor region and a potential of the at least one of the body layer and the first main electrode, an insulator that insulates the conductor region from the drift layer, the body layer, and the trench gate electrode, wherein the conductor region is disposed in a part in the gate trench, a first end of the conductor region is connected with the second semiconductor region, and a second end of the conductor region is connected with the first main electrode.

8. The semiconductor device according to claim 7, wherein the second semiconductor region is disposed over an entirety of the bottom part of the gate trench, and the conductor region is disposed along a part of a side wall surface of the gate trench.

9. The semiconductor device according to claim 7, wherein the second semiconductor region is disposed over an entirety of the bottom part of the gate trench, and the conductor region is disposed in a part in the gate trench.

* * * * *